United States Patent
Ventrudo

[19]

[11] Patent Number: 6,058,128
[45] Date of Patent: May 2, 2000

[54] APPARATUS FOR PROVIDING A STABILIZED LASER SOURCE

[75] Inventor: Brian F. Ventrudo, Ottawa, Canada

[73] Assignee: SDL, Inc., San Jose, Calif.

[21] Appl. No.: 08/621,555

[22] Filed: Mar. 25, 1996

[51] Int. Cl.$^7$ ........................................................ H01S 3/13
[52] U.S. Cl. .................................. 372/96; 372/6; 372/29; 372/33; 359/341
[58] Field of Search ................................... 385/37, 88, 92, 385/94; 372/6, 26, 28, 29, 31–33, 38, 43, 96, 98, 99, 102; 359/341

[56] References Cited

U.S. PATENT DOCUMENTS

| | | | |
|---|---|---|---|
| 4,802,178 | 1/1989 | Ury ........................................ | 372/38 X |
| 5,065,401 | 11/1991 | Scifres et al. ............................. | 372/38 |
| 5,333,142 | 7/1994 | Scheps ...................................... | 372/22 |
| 5,457,568 | 10/1995 | Jacobovitz-Veselka et al. ....... | 359/341 |
| 5,485,481 | 1/1996 | Ventrudo et al. ............................ | 372/6 |
| 5,499,135 | 3/1996 | Heidemann et al. ................... | 359/341 |
| 5,563,732 | 10/1996 | Erdogan et al. ......................... | 359/341 |
| 5,589,684 | 12/1996 | Ventrudo et al. .................. | 372/102 X |
| 5,592,503 | 1/1997 | Welch et al. .......................... | 372/96 X |
| 5,659,559 | 8/1997 | Ventrudo et al. ........................... | 372/6 |
| 5,703,893 | 12/1997 | Komiyama et al. ..................... | 372/43 |
| 5,841,797 | 11/1998 | Ventrudo et al. ........................... | 372/6 |
| 5,930,280 | 7/1999 | Rossi et al. ................................ | 372/50 |

*Primary Examiner*—John D. Lee
*Attorney, Agent, or Firm*—W. Douglas Carothers, Jr.

[57] ABSTRACT

Apparatus is provided for an improved stabilized laser source comprising a laser source having a light beam output and an electrical input. An optical waveguide, such as an optical fiber, having an input end is optically coupled to the laser source to receive the light beam. A reflector in the optical fiber, such as fiber grating, reflects a portion of the light beam output back into the laser source. The reflector is provided at a distance from the laser source permitting the laser source to switch between states of coherence and coherence collapse of operation. The electrical input of a drive signal for the laser source includes a modulated signal with variations in amplitude to the electrical input to control the variation in switching between the states of coherence and coherence collapse of the laser source so that continuous laser operation remains kink-free. The optical waveguide provides the laser source light beam output to an optical gain medium having an excited state of operation of duration equal to a relaxation time wherein intervals between the variations of drive current amplitude modulation are less than the relaxation time of the excited state of the optical gain medium.

71 Claims, 3 Drawing Sheets

APPARATUS FOR PROVIDING A STABILIZED LASER SOURCE

FIELD OF THE INVENTION

This invention relates generally to optical gain media coupled with optical gratings to provide for wavelength control and, more particularly, to an apparatus for stabilization of laser sources with an optically coupled waveguide grating in close proximity to the laser source which may be employed as an optical power source for an optical solid state amplifier or laser.

In U.S. Pat. No. 5,485,481, assigned to the same assignee of this application, and which is incorporated herein by reference, there is disclosed the utilization of a optical waveguide grating in the form of a fiber grating coupled to a gain medium comprising a semiconductor laser source to control and maintain the operation of the laser at a given wavelength within the laser bandwidth of operation. The fiber coupled laser is sometimes referred to as pigtailed laser. The assembly of the laser source together with the coupling optics and optic fiber pigtail are provided in a customer-convenient pin-out package.

As discussed in the above mentioned patent, the behavior of a semiconductor laser source under conditions of optical feedback is complicated by the effect of the laser cavity itself defined by the end facets of the semiconductor chip. The reflectivity of the grating as well as its wavelength are selected such that the broadband feedback from the laser cavity is greater than the feedback from the fiber grating. This is accomplished by insuring the reflectivity level of the front emitting facet of the laser source, providing feedback into the laser cavity, is higher than the reflectivity level provided from the pigtail fiber grating, providing reflected feedback into the laser cavity. The reflectivity level of the front facet of the laser source is very low to begin with to permit emission of the laser beam output but sufficient to provide for lasing conditions to be maintained in the laser source. The reflectivity of the fiber grating may be equal to but does not exceed the front facet reflectivity level. Thus, as an example, the reflectivity level of the grating in the fiber may be 3% while the reflectivity level of the front facet of the laser source may be 4%. Under these circumstances, the feedback from the fiber grating acts as a perturbation of the coherent optical field formed in the diode laser cavity. This perturbation acts to break the coherence of the laser emission, which is referred to as coherence collapse, broadening the bandwidth of the laser emission by several orders of magnitude, resulting in multiple longitudinal mode operation of the laser source. The fiber Bragg grating effectively locks the laser cavity output to the fixed wavelength of the fiber grating and centers the external cavity multi-longitudinal modes around that wavelength. The presence of the multi-longitudinal modes reduces the magnitude of mode-hopping noise in the laser. In addition, the center wavelength of emission remains near the wavelength of maximum reflection from the fiber grating. The laser source is, thus, constrained to operate within the grating bandwidth so that large fluctuations in wavelength of the laser source, such as caused by changes in temperature or current, are eliminated. Additionally, the laser source is not perturbed by extraneous optical feedback from reflective components located beyond the fiber grating, provided the level of extraneous feedback is less than that provided by the fiber grating.

To ensure the maintenance of the coherence collapse of the laser emission, the fiber grating is located at a sufficient optical distance from the front facet of the laser source, which may be, for example, about 50 cm. to 70 cm. from the laser source output facet. This distance must be greater than or equal to the coherence length of the laser source under the prescribed conditions of optical feedback, so that optical reflective feedback from the fiber grating, remains incoherent, thus assuring the laser remains in a state of coherence collapse. At this distance, the phase of the external feedback from the grating is uncorrelated to the phase of the laser source emission at substantially all levels of laser current and temperature operation.

On the other hand, if the grating is placed within a few centimeters or less of the laser source, then the feedback from the fiber grating may be coherent with the electric field inside the laser cavity, and very narrow linewidth operation of the laser will result. Such emission is very useful for some applications but is much less stable for the application of pumping optical solid state amplifiers and lasers because of the onset of laser cavity-mode transition noise when the laser operating characteristics change, such as may result from changes in operating temperature or pumping current. As a result, there are back-and-forth intermittent transitions from incoherent to coherent state operation of the laser that cause power output fluctuations detrimental to the operation of such amplifiers and lasers.

The necessity of locating the fiber grating at an optical distance from the laser diode that is equal to or greater than the coherence length of the laser may impose unacceptable packaging requirements on some applications because a large amount of fiber pigtail is required. On the other hand, if the pigtail is to be included in the same package that contains the laser source, this package must be large enough to contain the length of required pigtail fiber. This may be impractical. On the other hand, if a smaller package is used to contain the laser source, the need to locate the fiber grating a greater distance from the laser source will require the pigtail fiber to extend outside the package. In certain applications, this may expose the pigtail to potential damage as well as to temperature or pressure fluctuations sufficient to adversely affect operating characteristics of the laser source. Therefore, in cases where the laser source package is required to be compact particularly for use with an optical fiber amplifier or fiber laser, such as a rare-earth doped amplifier or laser, it is desirable to locate the fiber grating in the pigtail as close as possible to the laser source so that the pigtail may be included in the package. However, as indicated above, stable operation of the amplifier or laser will not be adequately maintained and the laser diode source, under these conditions, will intermittently shift between coherent to incoherent operation causing power glitches or power kinks in the amplifier/laser output with changes in laser operating temperature and laser diode modulated output.

Therefore, it is an object of this invention to effectively avoid the undesirable effects of intermittent coherent operation of the laser source when the optical grating is positioned within the coherence length of the laser source.

It is another object of this invention to affect the operating current for driving the laser source so as to stabilize the operation of the laser source for applied applications, such as optically pumping of fiber amplifiers.

SUMMARY OF THE INVENTION

According to this invention, apparatus for providing an improved stabilized laser source comprises a laser source having a light beam output and an electrical input. An optical waveguide having an input end is optically coupled to the laser source to receive the light beam. A reflector reflects a portion of the light beam output back into the laser source. The reflector is formed at a distance from the laser source to cause the laser source to switch intermittently between coherence and coherence collapse states of operation. Means are provided to the electrical input of a drive signal for the laser source with variations of amplitude to the electrical input to induce the laser source to repetitively switch operating states between coherence and coherence collapse. The optical waveguide provides the laser source light beam output to an optical gain medium having an excited state of operation of duration equal to a relaxation time wherein intervals between the variations of drive current amplitude are less than the relaxation time of the excited state of the optical gain medium.

More particularly, a laser source is provided with feedback from a grating formed in an external cavity coupled to the source is positioned within the coherence length of the laser source with controlled intermittent operation between coherence collapse and coherency states is a manner acceptable for application with solid state amplifiers or lasers containing an active gain element. Coherence collapse provides a substantially multimode operation of the laser source and is achieved by placing the grating in the external cavity a distance greater than the coherence length of the laser source and providing a reflective feedback from the grating to control the laser source wavelength to be equal to or lower than the reflectivity level provided from the internal cavity of the laser source, such as from the front emission facet of a semiconductor laser. If the grating is positioned within the external optical cavity to be within the coherence length of the laser source, intermittent switching between coherence collapse and coherence states of the laser source will occur which have a detrimental affect in pumping solid state optical amplifiers or lasers due to perturbations present in the optical pumping power from the laser diode source. These affects are effectively avoided in the application of this invention by applying a small, continuous modulation in the pumping current of the laser source that has a repetition rate that exceeds the relaxation time of the active gain element employed in the solid state amplifier or laser. The resulting effect is that the laser is controlled in its intermittent switching between coherence collapse and coherence states in a manner that the effect of the perturbations on the solid state amplifier or laser are substantially eliminated or otherwise so attenuated so that the gain stability of the solid state amplifier or laser is improved. The grating may be placed in an optical fiber and the solid state amplifier or laser may be a rare-earth doped single mode or multimode fiber amplifier or laser.

Other objects and attainments together with a fuller understanding of the invention will become apparent and appreciated by referring to the following description and claims taken in conjunction with the accompanying drawings.

PREFERRED EMBODIMENTS OF THE INVENTION

As used herein, "waveguide" means any optical waveguide which may be coupled to a laser source, such as a semiconductor laser diode or other light emitting laser source, capable of including an optical periodic or chirped grating. Examples of such optical waveguides are optical fibers, nonlinear crystal waveguides, planar waveguides, buried waveguides, and other such optical waveguide devices.

Figure 1:
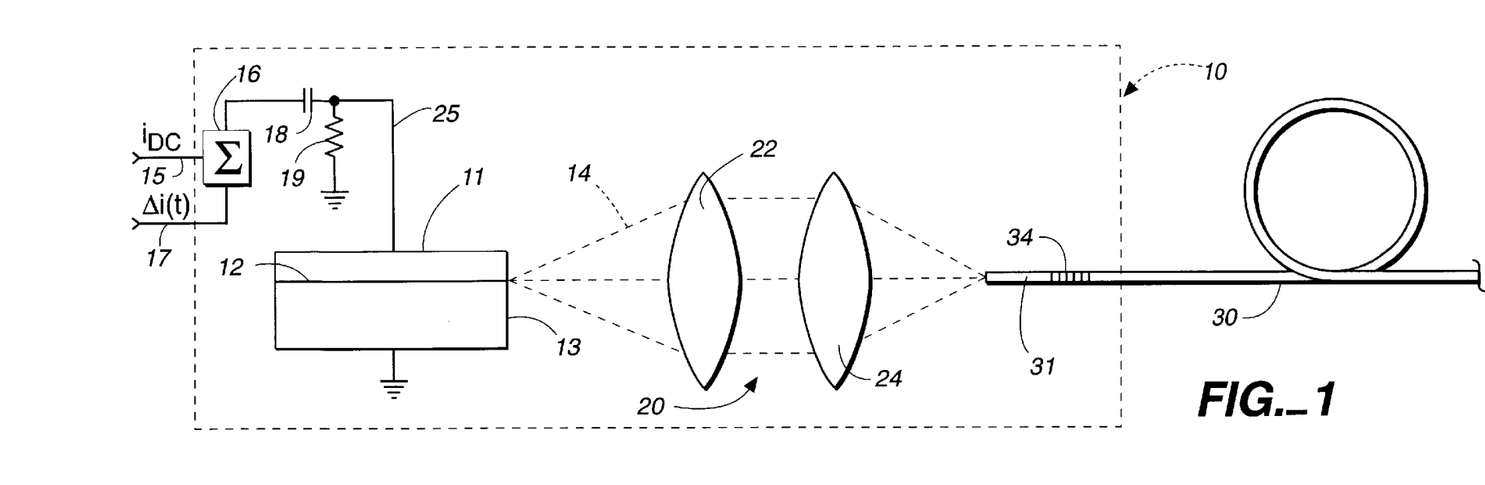
FIG. 1 is a schematic illustration of an embodiment of this invention as optically couple to an optical waveguide comprising a single mode, rare-earth doped amplifier laser.

Reference is now made to FIG. 1 and apparatus 10 illustrating an embodiment of this invention. Apparatus 10 comprises a laser source 11, such as a semiconductor laser diode or a semiconductor master oscillator with either an integrated or with an optically coupled semiconductor amplifier which are, in turn, optically coupled to a solid state active gain medium 30 via coupling optics 20. Laser source 11 has an active region 12, which also represents the laser optical cavity, that is pumped by means of an injection current 15, $i_{DC}$, which may be cw or pulsed, i.e., modulated, such as for transmission of binary data. The optical power output from the exit or output facet 13 of laser source 11 is collimated and focused by optics 20 for input to the end of an optical waveguide 31, which is shown here as an optical fiber portion. Optics 20 is a conventional lens system and may comprise a lens 22 to collect and collimate the output beam 14 from output facet 13 and lens 24 to focus the collimated beam to a diffraction limited spot of numerical aperture acceptable by the end of optical waveguide 31.

Figure 3:
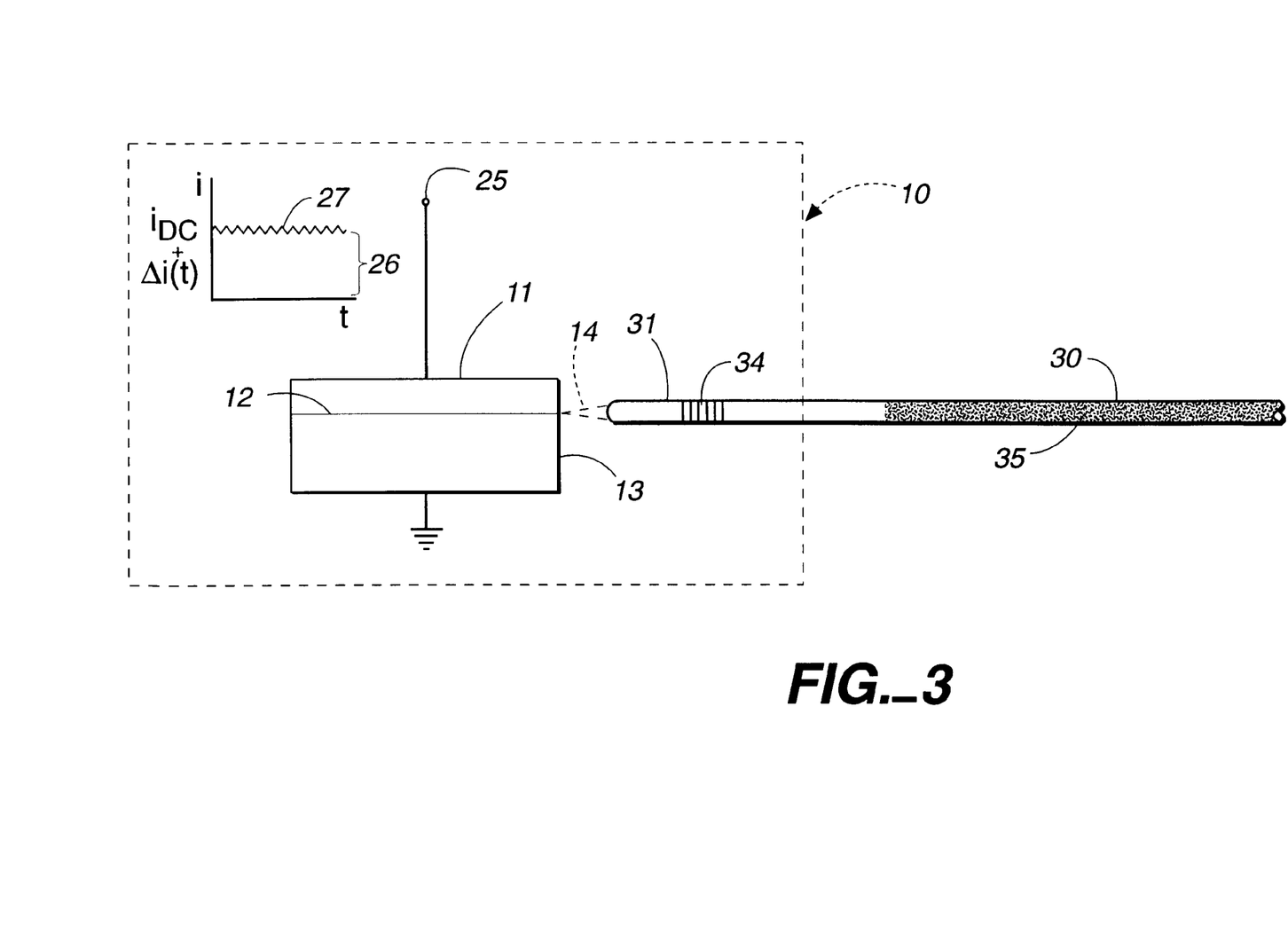
FIG. 3 is a schematic illustration of an embodiment of this invention similar to FIG. 1 except with different type of optical coupling to the optical waveguide.

Alternatively, as shown in FIG. 3, optical coupling of laser source 11 to optical waveguide 31 may be accomplished by butt coupling, for example, wherein output beam 14 from laser source 11 is coupled directly into the lensed end of optical waveguide 31.

Apparatus 10 also includes an optical periodic or chirped grating 34 formed in the optical waveguide 31 in close proximity to output facet 13. As an example, grating 34 may be about 2 cm to 3 cm away from the laser facet 13, i.e., well within the coherence length of laser source 11, which length may be tens of centimeters. Grating 34 may be formed in optical waveguide 31 by techniques known in the art including, but not limited to, the use of ultraviolet light and masking techniques.

Laser output facet 13 forms an optical cavity with the laser rear facet and has a reflectivity level suitable for reflecting a small portion of the propagating radiation in the laser cavity back into active region 12 to maintain oscillating conditions and stimulated emission of laser source 11. External grating 34 also reflects a small portion of the propagating radiation back into the laser optical cavity to control the wavelength of emission of laser source 11 independent of variations in laser operating temperature and current via coherence collapse operation of laser source 11. As taught in U.S. Pat. No. 5,485,481, it is preferred that the reflectivity level of output facet 13 of laser source 11, providing reflected feedback into the laser cavity, be equal to or higher than the reflectivity level provide from grating 34. These reflectivity levels are both relatively low, generally not exceeding 10%.

Solid state active gain medium 30 may be an optical fiber amplifier or laser formed in either a single core or double clad optical fiber. In these respective optical fiber applications, the core or inner cladding is doped with an active gain element. Examples of such an active gain element are rare-earth dopants, such as rare-earth ions $Er^{3+}$, $Nd^{3+}$, $Yb^{3+}$, $Tm^{3+}$ or $Pr^{3+}$ or combinations thereof, such as a co-doped Er:Yb core in a single mode fiber. If gain medium 30 includes the incorporation of a pair of fiber gratings, reflected radiation between these gratings forms an oscillator cavity within the amplifier medium forming lasing conditions. Such solid state amplifiers and lasers are highly useful in telecommunication applications.

As previously indicated, the problem of placing grating 34 within the coherence length of laser source 11 is that the optical feedback from grating into active region 12 causes intermittent switching between coherence collapse and coherence states of laser source 11 resulting in fluctuations of laser output power transmitted through the grating, which is undesirable in many applications of such an apparatus. Such fluctuations are, for example, manifested by power level spikes in the output of source 11 due to changes in laser operating temperature or injection current. As an example, the coherence state may be a narrow band of wavelengths, such as 10 MHz, with a dominate emission wavelength, $\lambda_g$, governed by the period of grating 34. In the coherence collapse state, the gain spectrum of laser source 11 is expanded to include a plurality of longitudinal modes having a broad band of wavelengths, such as 10 GHz, with a dominate emission wavelength, $\lambda_g$, governed by the period of grating 34. Generally, a type of collapse is desired such that no single longitudinal mode produced by laser source 11 within the gain spectrum contains more than about 20% of the total optical power produced by source when in the collapsed state. The switching between states does not occur if grating 34 is positioned in optical waveguide 31 a sufficient distance from output facet 13 so that laser source 11 will remain in a state of coherence collapse and the phase of the external feedback from grating 34 is uncorrelated to the phase of laser emission at substantially all levels of laser operating current and temperatures.

Sometimes such longer optical waveguides 31 are not convenient for particular applications, as previously indicated. Therefore, it is desirable in those cases that grating 34 be placed much closer to output facet 13 of laser source 11; however, as a result, intermittent switching between coherence collapse and coherent states of laser source 11 will occur causing power fluctuations in output beam 14. To effectively avoid the effects of this intermittent switching in the operation of laser source 11, a small variation in the injection current is provided which also varies the phase of the laser emission to effectively drive laser source 11 into and out of controlled coherence collapse. In other words, the intermittent switching of laser source 11 between coherency and coherence collapse states is controlled in a particular manner. If the time interval between these state transitions is about equal to or shorter than the relaxation time, lifetime or recombination time of the excited or fluorescence state of active gain element 35 in gain medium 30, then the performance of gain medium 30 will not be affected by the intermittent switching between coherence collapse and coherency states of laser source 11 thereby improving the gain stability of fiber gain medium 30. As an example, if gain medium 30 has incorporated an active gain element comprising Er ions, the fluorescence lifetime of Er is about 10 ms., which corresponds to a periodic variation of about 100 Hz. If a small periodic variation in the drive current is applied, such as having a modulated rate of ten times greater than that required to maintain the gain saturation of the amplifier, e.g., about 1 kHz to about 10 kHz or more, the power fluctuations in the output of laser source 11 on gain medium 30 will be effectively eliminated or otherwise substantially attenuated. Thus, if the average time interval between variation is less than the fluorescence lifetime of the rare-earth dopant of gain medium 30, typically from several 100 μsec. to 1 msec., then the switching between states of coherence collapse and coherency will be controlled so that the effects of power level spikes or power output kinks are effectively avoided.

As shown in the embodiment illustrated in FIG. 1, laser injection current 15, $i_{DC}$, is for operating laser source 11. Injection current, $i_{DC}$, may be cw or pulsed, e.g., modulated to be representative of binary data in an optical communication system which is amplified by gain medium 30 for transmission. Also, a supplemental varying input current 17 provides a smaller modulated signal, $\Delta i(t)$, to affirmatively drive laser source 11 into and out of coherence collapse. Injection signal 15 is summed with varying input current 17 at 16 to provide an input signal at 25 for driving laser source 11. An electronic semiconductor chip or other circuit for providing modulated signal, $\Delta i(t)$, may be included as part of the package comprising apparatus 10 which is represented by the dotted rectangle in FIG. 1. This aspect is discussed in more detail later.

In FIG. 3, a representation of input signal 25 is shown as cw current 26, $i_{DC}$, with a superimposed periodic modulated signal 27 having a frequency in excess of the relaxation time of the fluorescence lifetime of the active gain element 35 of gain medium 30, e.g., in excess of 1 kHz.

The repetitive variation of the input current may be periodic or stochastic, i.e., a random noise component. If such a noise signal is employed, then a high pass filter may be required to remove low frequency noise present in the input signal which could affect gain media operation. Such a filter, shown in FIG. 1, is an RC filter comprising capacitor 18 and resistor 19.

Figure 2:
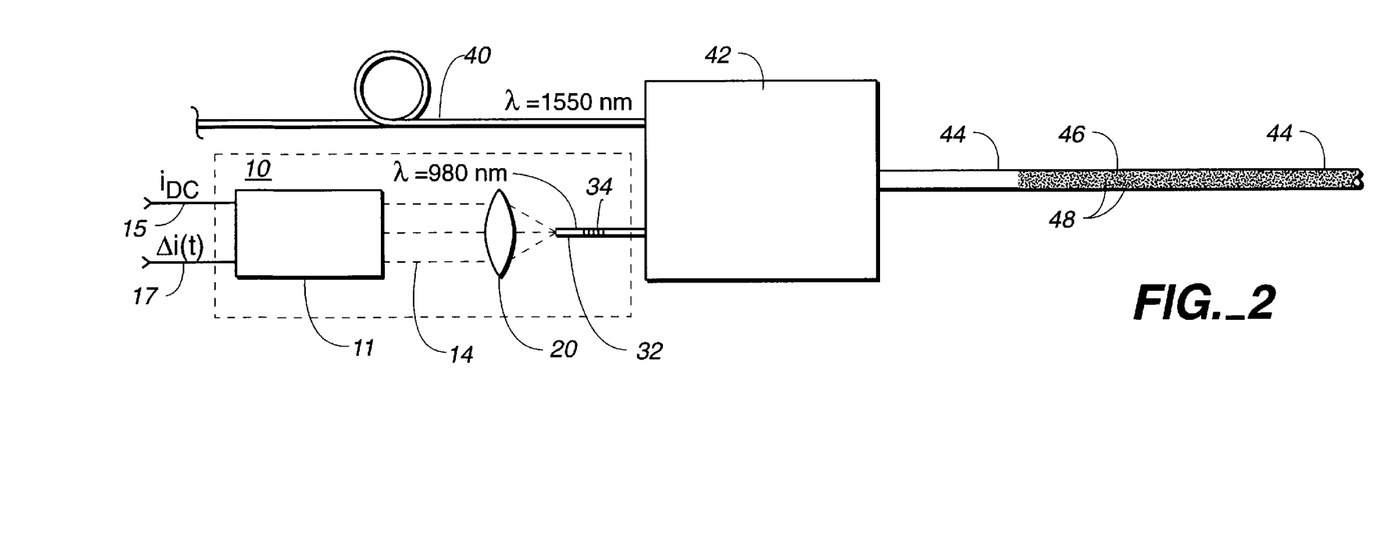
FIG. 2 is a schematic illustration of an embodiment of this invention as applied to an optical waveguide comprising a rare-earth doped amplifier or laser.

In the embodiment shown in FIG. 2, apparatus 10 is shown as applied to a telecommunication application. Apparatus 10 is generally the same as that shown in FIG. 1 except that an application is illustrated for amplifying an optical signal. Grating 34 is in a short, undoped fiber end portion 31 within the coherence length of laser source 11. If grating 34 were to be placed beyond the coherence length of laser source 11, laser source 11 would provide a continuous dominate output wavelength of 980 nm via cw or pulsed injection current 15, $i_{DC}$. Since grating 34 is within the coherence length of laser source 11, e.g., 2 to 3 cm. from output facet 13, apparatus 10 is provided with a small varying input current, $\Delta i(t)$, modulated at a rate about equal to or in excess of the reciprocal of the relaxation time of the active gain element in a pumped gain medium 44. As previously explained, the varying input current attenuates effects of uncontrolled intermittent switching between coherence collapse and coherency states of source 11. A communication transmission fiber 40 carries a communication signal at a wavelength of 1550 nm. Gain medium 44 comprises a fiber amplifier 46 that has a section doped with Er ions 48. Conventional coupling optics 42 couples the signal from transmission fiber 40 into the core of fiber 44 and the pump signal from fiber 32 into the inner cladding of fiber 44. Apparatus 10 is an ideal pump source for the high power amplifier 46 providing an output wavelength of 980 nm within the absorption band of Er doped, fiber amplifier 46, resulting in gain for the 1550 nm signal propagating in its core.

It should be recognized that more than one laser source 11 may be utilized in the practice of this invention. As an example, at least two independent laser sources may be optically coupled as input to gain medium 30, wherein the respective laser sources are driven by varying signals in accordance with the teachings of this invention to improve the gain stability of gain medium 30 over its gain spectrum band. The respective modulated signals for each laser source may be (1) synchronous or asynchronous, (2) either in phase, out of phase or of alternating phase, and/or (3) of the same or of different amplitude and/or frequency.

Also, in bringing about the coherence collapse, whether controlled as in the case here or continuous as in the case of U.S. Pat. No. 5,485,481, a plurality of longitudinal modes is produced having a broad band of wavelengths substantially centered about an emission wavelength, $\lambda_g$, governed by the period of grating 34. The control of coherence collapse is brought about so that no single longitudinal mode produced by the laser contains more than about 20% of the total of optical power by the laser.

Figure 4:
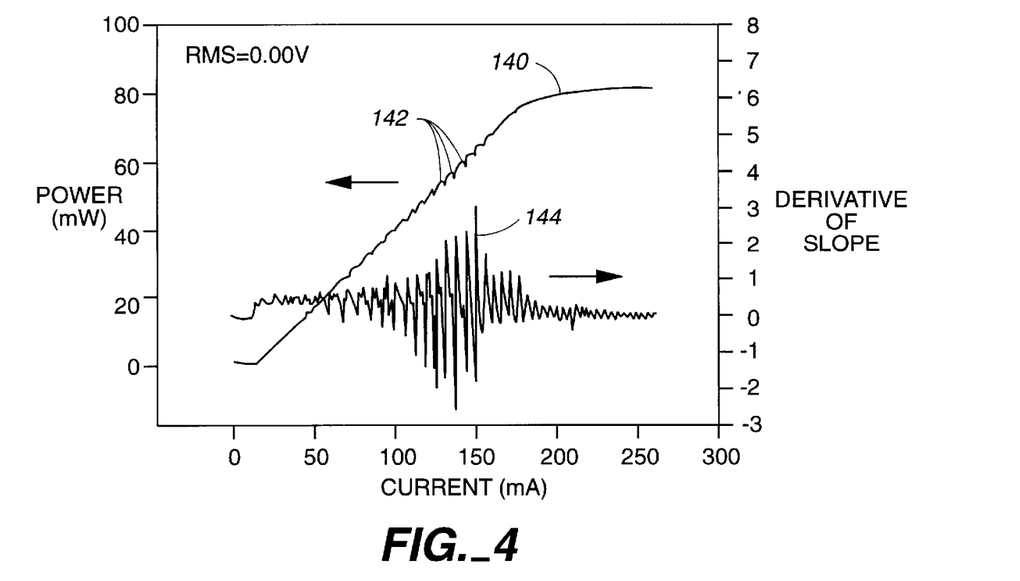
FIG. 4 is a graphic illustration of the power versus current output of a pigtailed laser diode source with a grating close to the laser diode without the application of the teachings of this invention.
Figure 5:
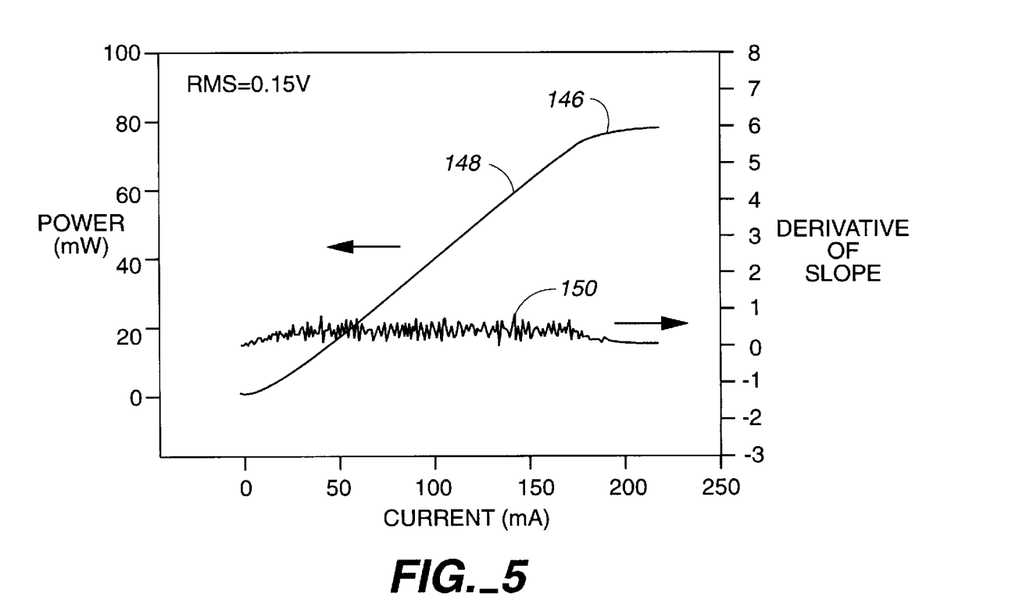
FIG. 5 is a graphic illustration of the power versus current output a pigtailed laser diode source with a grating close to the laser diode with the application of this invention.

FIGS. 4 and 5 are graphical illustrations of the utility of this invention. The power versus current curve 140 in FIG. 4 has a plurality of kinks 42 due to the placement of the a fiber Bragg grating within the coherence length of a semiconductor laser diode, that is within a few centimeters or less relative to the front facet of the laser diode. Kinks 142 are caused by the laser diode switching between states of coherency and coherence collapse. The top of kinks 142 correspond to the laser diode operating in a state of coherence collapse. The bottom of kinks 142 correspond to the laser diode operating in a state of coherency. Curve 144 is a derivative of the slope of the power versus current curve 140 which illustrates the extent of the noise caused by kinks 142 in curve 140. Kinks 142 in curve 140 are not acceptable in the employment of the pigtailed laser diode with a solid state amplifier or laser because its utility depends on a smooth monotonic increase in power as a function of the applied injection current. The effects of these kinks are accentuated, for example, when the output of the laser diode is employed for pumping a solid state amplifier. However, if the state of coherence collapse is controlled according to the teachings of the invention, such as by controlling the variation of switching between states of coherency and coherence collapse, the extent of kinks 142 can be attenuated over time as shown in FIG. 5. In FIG. 5, a portion of the drive current is modulated with time variations of duration less than a relaxation time of the excited state of the active gain element of the amplifier so that kinks 142 are averaged over time producing a power versus current curve 146 that is significantly smoother than curve 140 in FIG. 4, as evidence by comparison of its derivative of slope curve 150 with the original slope curve 144 in FIG. 4.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. Apparatus for providing an improved stabilized laser source comprising:

a laser source having a light beam output and an electrical input;

an optical waveguide having an input end optically coupled to said laser source to receive said light beam;

a reflector to reflect a portion of said light beam output back into said laser source, said reflector formed at a distance from said laser source to cause said laser source to switch between coherence and coherence collapse states of operation; and means for providing to said electrical input a drive signal with variations of amplitude to induce said laser source to repetitively switch operating states between coherence and coherence collapse.

2. The apparatus of claim 1 wherein said optical waveguide provides said light beam output to an optical gain medium having an excited state of operation of duration equal to a relaxation time, and wherein intervals between said amplitude variations are less than said relaxation time of the excited state of said optical gain medium.

3. The apparatus of claim 2 wherein said gain medium includes an active gain element comprising a rare-earth element.

4. The apparatus of claim 1 wherein a reflectivity level of said reflector is approximately equal to or less than a reflectivity level provided by feedback in said laser source.

5. The apparatus of claim 1 wherein said reflector comprises a perturbation in said optical waveguide.

6. The apparatus of claim 1 wherein said reflector comprises a grating in said optical waveguide.

7. The apparatus of claim 1 wherein said laser source is capable of generating optical power in each of a plurality of longitudinal modes within a gain spectrum of said laser source, said coherence collapse state of operation preventing said laser source from generating optical power in any one of said longitudinal modes that is greater than about twenty percent of a total of the optical power of all said longitudinal modes generated by said laser source.

8. A gain medium system pumped at a first wavelength from a first gain medium optically coupled into a second gain medium comprising:

a first optical cavity associated with said first gain medium for generating an optical output of said first wavelength through application of an electrical driving signal;

said second gain medium having at least one active gain element having an excited fluorescence state of predetermined lifetime duration;

a wavelength selective reflector optically coupled to said first medium, said reflector providing sufficient feedback into said first optical cavity to cause said first gain medium to oscillate at said first wavelength;

a source to modulate at least a portion of said applied signal having a modulation rate providing time variation of shorter duration than the lifetime duration of the active gain element fluorescence state.

9. The gain medium system of claim 8 wherein said modulated portion of said applied signal causes said first gain medium to be driven into a state of at least momentary coherence collapse.

10. The gain medium system of claim 8 further comprising means to modulate said first gain medium superimposed with said time variation.

11. The gain medium system of claim 8 wherein said time variation is periodic.

12. The gain medium system of claim 8 wherein said time variation is stochastic.

13. The gain medium system of claim 8 wherein said time variation is at least five times less than the lifetime duration of said second gain medium.

14. The gain medium system of claim 8 wherein said time variation is at least five times faster than the lifetime of said active gain element.

15. The gain medium system of claim 8 wherein said modulation rate is in the range of about 1 kHz to 10 kHz or greater.

16. The gain medium system of claim 8 further comprising a high-pass filter coupled between said modulated source and said first gain medium to remove low frequency modulation therefrom.

17. The gain medium system of claim 8 wherein said at least one active gain element comprises a rare-earth element.

18. The gain medium system of claim 17 wherein said rare-earth element comprises rare-earth ions of $Er^{3+}$, $Nd^{3+}$, $Yb^{3+}$, $Tm^{3+}$ or $Pr^3$ or combinations thereof.

19. The gain medium system of claim 8 wherein said reflector feedback is provided from an optical fiber grating, said optical fiber grating feedback having a reflectivity level approximately equal to or less than a reflectivity level provided by feedback in said first optical cavity.

20. The gain medium system of claim 8 wherein said wavelength selective reflector comprises a grating element.

21. The gain medium system of claim 20 wherein said grating element is a periodic or a chirped grating.

22. The gain medium system of claim 8 wherein said modulating source causes said first gain medium to controllably switch between states of coherency and coherence collapse.

23. The gain medium system of claim 22 wherein said controlled switching comprises switching between said states.

24. A semiconductor laser apparatus comprising:
a semiconductor laser with an active region for generating radiation and producing optical gain;
reflectivity means for providing optical feedback to said active region;
an optical fiber optically coupled to said active region;
a grating formed in said optical fiber which provides at least a portion of said optical feedback;
electronic drive means for powering and modulating said laser; and
means including at least a portion of said laser modulation having a modulation rate sufficient to induce multiple longitudinal mode operation of said laser.

25. The semiconductor laser apparatus of claim 24 wherein said laser is utilized to excite a solid state gain medium itself capable of exhibiting optical gain.

26. The semiconductor laser apparatus of claim 25 wherein said solid state gain medium is a fiber amplifier.

27. The semiconductor laser apparatus of claim 26 wherein said modulation rate is in excess of 1 kHz.

28. The semiconductor laser apparatus of claim 25 wherein said solid state gain medium is characterized by a characteristic excited state recombination time; said modulation rate of said laser being faster than said recombination time so as to produce improved gain stability from said solid state gain medium.

29. The semiconductor laser apparatus of claim 25 further comprising:
at least two active region sources for generating radiation to excite said solid state gain medium;
at least one of said sources modulated to improve the gain stability of said solid state gain medium.

30. The semiconductor laser apparatus of claim 24 wherein said optical fiber is a fiber amplifier.

31. The semiconductor laser apparatus of claim 24 wherein no single longitudinal mode produced by said laser active region contains more than about 20% of total optical power produced by said laser active region.

32. The semiconductor laser apparatus of claim 24 wherein said optical fiber is a solid state laser and said modulation rate is in excess of 1 kHz.

33. The semiconductor laser apparatus of claim 32 wherein no single longitudinal mode produced by said laser active region contains more than about 20% of a total of optical power produced by said laser active region.

34. The semiconductor laser apparatus of claim 32 wherein said laser modulation is unsynchronized.

35. A solid state gain medium system comprising:
at least one semiconductor laser source optically coupled to a solid state gain medium;
said laser source receiving an excitation signal and producing radiation under lasing conditions;
said solid state medium doped to absorb radiation from said laser source in order to produce optical gain;
at least a portion of the excitation signal to said laser source being modulated at a rate which exceeds the characteristic relaxation rate of said solid state gain medium for improving the gain stability of said solid state gain medium;
said laser source producing more longitudinal modes than if said excitation signal were not so modulated.

36. The gain medium system of claim 35 wherein said at least excitation signal portion is a modulation signal in excess of 1 kHz.

37. The gain medium system of claim 36 wherein said at least excitation signal portion is a modulation signal in excess of 10 kHz.

38. The gain medium system of claim 35 wherein there are at least two laser sources modulated by separate modulation signals to improve the gain stability of said solid state gain medium.

39. The gain medium system of claim 38 wherein said modulated signals are asynchronous.

40. The gain medium system of claim 38 wherein said modulated signals are of alternate phase relative to each other.

41. The gain medium system of claim 38 wherein said modulated signals are synchronous.

42. The gain medium system of claim 35 wherein no single longitudinal mode produced by said at least one semiconductor laser source contains more than about 20% of a total of optical power produced by said source.

43. The gain medium system of claim 35 wherein said solid state gain medium is an optical fiber.

44. The gain medium system of claim 35 wherein said solid state gain medium is a fiber laser or amplifier.

45. The gain medium system of claim 35 wherein said solid state gain medium is a solid state laser or amplifier.

46. The gain medium system of claim 35 wherein said semiconductor laser source operates during at least a portion of its operating time in a single longitudinal mode in absence of said modulation.

47. A method of controlling the operation of an optical amplifier comprising the steps of:
optically coupling a laser source to a solid state medium having an active gain element for amplifying an optical signal coupled into the amplifier, the active gain element having an excited state of predetermined lifetime;
electrically driving the laser source to provide optical power for coupling into the solid state medium to cause said active gain element to be elevated to its excited state;
superimposing on the electrical signal a modulated signal having a repetitive rate providing interspatial pulse time periods of shorter duration than the predetermined lifetime of the active gain element, the modulated signal having a modulation time period that is shorter than the predetermined lifetime of the active gain element.

48. A method of controlling the operation of an optical amplifier comprising the steps of:

optically coupling a laser source to a solid state medium having an active gain element for amplifying an optical signal coupled into the amplifier, the active gain element having an excited state of predetermined lifetime;

electrically driving the laser source with a signal to provide optical power for coupling into the solid state medium to cause said active gain element to be elevated to its excited state;

modulating at least a portion of the electrical driving signal having a modulation time period shorter than the predetermined lifetime of the active gain element;

operating said laser source during at least a portion of its operating time in a single longitudinal mode in absence of said modulation.

49. A method of controlling the operation of an optical amplifier comprising the steps of:

optically coupling a laser source to a fiber grating, output from said source exciting a solid state medium having an active gain element for amplifying an optical signal coupled into the amplifier, the active gain element having an excited state of predetermined lifetime;

electrically driving the laser source to provide optical power for coupling into the solid state medium to cause said active gain element to be elevated to its excited state; and modulating at least a portion of the electrical signal to induce a state of controlled coherence collapse in the laser source.

50. The method of controlling the operation of an optical amplifier of claim 49 wherein the state of controlled coherence collapse in said step of modulating comprises the step of:

operating the laser source between states of coherency and coherence collapse for stabilizing the optical output power of the amplifier.

51. Apparatus for providing an improved stabilized laser source comprising:

a laser source having a light beam output and an electrical input;

an optical fiber having an input end coupled to said laser source to receive said light beam;

a fiber grating in said fiber for reflecting a portion of said light beam output back into said laser source;

means for modulating said laser electrical input;

said modulation induces said laser source to repetitively switch operating states between coherence and coherence collapse.

52. The apparatus of claim 51 wherein said modulating means comprises amplitude modulation provided at said electrical input.

53. Apparatus for providing an improved stabilized laser source comprising:

a laser source having a light beam output and an electrical input;

an optical fiber having an input end coupled to said laser source to receive said light beam;

a fiber grating in said fiber for reflecting a portion of said light beam output back into said laser source;

means for modulating said laser electrical input;

said fiber grating formed in said optical fiber at a distance from said laser source to cause said laser source to switch between coherence and coherence collapse states of operation.

54. Apparatus for providing an improved stabilized laser source comprising:

a laser source having a light beam output and an electrical input;

an optical fiber having an input end coupled to said laser source to receive said light beam;

a fiber grating in said fiber for reflecting a portion of said light beam output back into said laser source;

means for modulating said laser electrical input; and an optical gain medium coupled to receive the light beam output from said optical fiber, said optical gain medium having an excited state of operation of duration equal to a relaxation time, and wherein intervals between variations of amplitude of said modulating means are less than said relaxation time of the excited state of said optical gain medium.

55. Apparatus for providing an improved stabilized laser source comprising:

a laser source having a light beam output and an electrical input;

an optical fiber having an input end coupled to said laser source to receive said light beam;

a fiber grating in said fiber for reflecting a portion of said light beam output back into said laser source;

means for modulating said laser electrical input; and an optical gain medium coupled to receive the light beam output from said optical fiber, said optical gain medium having an excited state of operation of duration equal to a relaxation time, and wherein the rate of modulation of said modulating means is higher than the reciprocal of the relaxation time of said optical gain medium.

56. Apparatus for providing an improved stabilized laser source comprising:

a laser source having a light beam output and an electrical input;

an optical fiber having an input end coupled to said laser source to receive said light beam;

a fiber grating in said fiber for reflecting a portion of said light beam output back into said laser source;

means for modulating said laser electrical input;

said modulation means for controlling the variation of switching between states of coherence and coherence collapse in the operation of said laser source so that its operation is maintained kink-free.

57. An apparatus comprising:

an enclosure with a terminal that receives an electric input;

a laser source having a light beam output and coupled to receive said electrical input for driving said laser source;

said laser source included in said enclosure;

an optical waveguide having an input end optically coupled to said laser source to receive said light beam;

a reflector coupled to said optical waveguide to reflect a portion of said light beam output back into said laser source to stabilize the operation of said laser source; and an electrical circuit included in said enclosure and coupled to said electrical input for providing a modulated signal, $\Delta i(t)$, as part of said electrical input for driving said laser source to stabilize the operation of said laser source.

58. The apparatus of claim 57 wherein said electrical input in combination with said reflector causes said laser source to operate in coherence collapse to stabilize the operation of said laser source.

59. The apparatus of claim 57 wherein said waveguide is an optical fiber and said reflector is a fiber grating.

60. The apparatus of claim 59 wherein said fiber grating is formed in said fiber within the coherence length of said laser source.

61. The apparatus of claim 57 wherein said waveguide is an optical fiber.

62. The apparatus of claim 57 wherein said modulated signal, $\Delta i(t)$, comprises an amplitude modulation provided at said electrical input.

63. The apparatus of claim 57 wherein the output from said waveguide is coupled to an optical gain medium.

64. The apparatus of claim 63 wherein said waveguide is an optical fiber and said optical gain medium is an optical amplifier.

65. The apparatus of claim 64 further comprising a fiber grating in said optical fiber to reflect a portion of said light beam output back into said laser source to stabilize the operation of said laser source.

66. Apparatus comprising:

a laser source having a light beam output and an electrical input;

an optical waveguide having an input end coupled to said laser source to receive said light beam;

a reflector in said optical waveguide for reflecting a portion of said light beam output back into said laser source to stabilize the operation of said laser source; and an electrical circuit coupled to said electrical input for providing a modulated signal, $\Delta i(t)$, as part of said electrical input for driving said laser source to further stabilize the operation of said laser source;

said electrical input in combination with said reflector causes said laser to operate in coherence collapse to stabilize the operation of said laser source.

67. The apparatus of claim 66 wherein said reflector is formed in said waveguide within the coherence length of said laser.

68. The apparatus of claim 67 wherein said waveguide is an optical fiber and said reflector is a fiber grating formed in said optical fiber.

69. The apparatus of claim 66 wherein said waveguide is an optical fiber and said reflector is a fiber grating formed in said optical fiber.

70. The apparatus of claim 66 wherein said modulated signal, $\Delta i(t)$, comprises an amplitude modulation provided at said electrical input.

71. The apparatus of claim 70 wherein the output from said waveguide is coupled to an optical gain medium.

* * * * *